(12) United States Patent
Ekberg

(10) Patent No.: US 10,525,547 B2
(45) Date of Patent: Jan. 7, 2020

(54) ADDITIVE MANUFACTURING OF THREE-DIMENSIONAL ARTICLES

(71) Applicant: Arcam AB, Moelndal (SE)

(72) Inventor: Christian Ekberg, Hindas (SE)

(73) Assignee: Arcam AB, Moelndal (SE)

( * ) Notice: Subject to any disclaimer, the term of this patent is extended or adjusted under 35 U.S.C. 154(b) by 438 days.

(21) Appl. No.: 15/495,323

(22) Filed: Apr. 24, 2017

(65) Prior Publication Data

US 2017/0348791 A1 Dec. 7, 2017

Related U.S. Application Data

(60) Provisional application No. 62/344,051, filed on Jun. 1, 2016.

(51) Int. Cl.
  *B23K 15/00* (2006.01)
  *B23K 15/06* (2006.01)
  (Continued)

(52) U.S. Cl.
  CPC ...... *B23K 15/0086* (2013.01); *B23K 15/0026* (2013.01); *B23K 15/02* (2013.01);
  (Continued)

(58) Field of Classification Search
  CPC ........ B23K 15/00; B23K 15/06; B23K 15/02; B33Y 10/00; B33Y 50/02; B33Y 30/00
  (Continued)

(56) References Cited

U.S. PATENT DOCUMENTS

| 2,264,968 A | 12/1941 | De Forest |
| 2,323,715 A | 7/1943 | Kuehni |

(Continued)

FOREIGN PATENT DOCUMENTS

| CA | 2860188 A1 | 6/2006 |
| CN | 101607311 A | 12/2009 |

(Continued)

OTHER PUBLICATIONS

Cheah, Chi-Mun, et al., "Automatic Algorithm for Generating Complex Polyhedral Scaffold Structure for Tissue Engineering", Tissue Engineering, 2004, pp. 595-610, vol. 10, No. 3/4, XP002691483.

(Continued)

*Primary Examiner* — Samuel M Heinrich
(74) *Attorney, Agent, or Firm* — Dinsmore & Shohl LLP

(57) ABSTRACT

A method is provided for forming a three-dimensional article through successively depositing individual layers of powder material that are fused together so as to form the article, the method comprising the steps of: providing at least one electron beam source emitting an electron beam for at least one of heating or fusing the powder material, where the electron beam source comprises a cathode, an anode, and a Wehnelt cup between the cathode and anode; providing a guard ring between the Wehnelt cup and the anode and in close proximity to the Wehnelt cup, where the guard ring is having an aperture which is larger than an aperture of the Wehnelt cup; protecting the cathode and/or the Wehnelt cup against vacuum arc discharge energy currents when forming the three-dimensional article by providing the guard ring with a higher negative potential than the Wehnelt cup and cathode.

15 Claims, 6 Drawing Sheets

(51) Int. Cl.
*B23K 15/02* (2006.01)
*B33Y 10/00* (2015.01)
*B33Y 50/02* (2015.01)
*B33Y 30/00* (2015.01)

(52) U.S. Cl.
CPC .............. *B23K 15/06* (2013.01); *B33Y 10/00* (2014.12); *B33Y 30/00* (2014.12); *B33Y 50/02* (2014.12)

(58) Field of Classification Search
USPC ...................................... 219/121.12–121.35
See application file for complete search history.

(56) References Cited

U.S. PATENT DOCUMENTS

| | | |
|---|---|---|
| 3,634,644 A | 1/1972 | Ogden et al. |
| 3,838,496 A | 10/1974 | Kelly |
| 3,882,477 A | 5/1975 | Mueller |
| 3,906,229 A | 9/1975 | Demeester et al. |
| 3,908,124 A | 9/1975 | Rose |
| 4,314,134 A | 2/1982 | Schumacher et al. |
| 4,348,576 A | 9/1982 | Anderl et al. |
| 4,352,565 A | 10/1982 | Rowe et al. |
| 4,401,719 A | 8/1983 | Kobayashi et al. |
| 4,541,055 A | 9/1985 | Wolfe et al. |
| 4,625,150 A * | 11/1986 | Rand ................ H01J 35/14 313/424 |
| 4,651,002 A | 3/1987 | Anno |
| 4,818,562 A | 4/1989 | Arcella et al. |
| 4,863,538 A | 9/1989 | Deckard |
| 4,888,490 A | 12/1989 | Bass et al. |
| 4,927,992 A | 5/1990 | Whitlow et al. |
| 4,958,431 A | 9/1990 | Clark et al. |
| 4,988,844 A | 1/1991 | Dietrich et al. |
| 5,118,192 A | 6/1992 | Chen et al. |
| 5,135,695 A | 8/1992 | Marcus |
| 5,167,989 A | 12/1992 | Dudek et al. |
| 5,182,170 A | 1/1993 | Marcus et al. |
| 5,204,055 A | 4/1993 | Sachs et al. |
| 5,247,560 A | 9/1993 | Hosokawa et al. |
| 5,393,482 A | 2/1995 | Benda et al. |
| 5,483,036 A | 1/1996 | Giedt et al. |
| 5,508,489 A | 4/1996 | Benda et al. |
| 5,511,103 A | 4/1996 | Hasegawa |
| 5,595,670 A | 1/1997 | Mombo Caristan |
| 5,633,507 A * | 5/1997 | Pfeiffer ................ B82Y 10/00 250/398 |
| 5,647,931 A | 7/1997 | Retallick et al. |
| 5,753,274 A | 5/1998 | Wilkening et al. |
| 5,837,960 A | 11/1998 | Lewis et al. |
| 5,876,550 A | 3/1999 | Feygin et al. |
| 5,904,890 A | 5/1999 | Lohner et al. |
| 5,932,290 A | 8/1999 | Lombardi et al. |
| 6,046,426 A | 4/2000 | Jeantette et al. |
| 6,162,378 A | 12/2000 | Bedal et al. |
| 6,204,469 B1 | 3/2001 | Fields et al. |
| 6,419,203 B1 | 7/2002 | Dang |
| 6,537,052 B1 | 3/2003 | Adler |
| 6,554,600 B1 | 4/2003 | Hofmann et al. |
| 6,583,379 B1 | 6/2003 | Meiners et al. |
| 6,593,686 B1 * | 7/2003 | Yui ................ H01J 3/02 250/492.22 |
| 6,676,892 B2 | 1/2004 | Das et al. |
| 6,724,001 B1 | 4/2004 | Pinckney et al. |
| 6,746,506 B2 | 6/2004 | Liu et al. |
| 6,751,516 B1 | 6/2004 | Richardson |
| 6,764,636 B1 | 7/2004 | Allanic et al. |
| 6,811,744 B2 | 11/2004 | Keicher et al. |
| 6,815,636 B2 | 11/2004 | Chung et al. |
| 6,824,714 B1 | 11/2004 | Türck et al. |
| 6,992,307 B2 * | 1/2006 | Yui ................ H01J 37/065 250/492.1 |
| 7,003,864 B2 | 2/2006 | Dirscherl |
| 7,020,539 B1 | 3/2006 | Kovacevic et al. |
| 7,165,498 B2 | 1/2007 | Mackrill et al. |
| 7,204,684 B2 | 4/2007 | Ederer et al. |
| 7,291,002 B2 | 11/2007 | Russell et al. |
| 7,452,500 B2 | 11/2008 | Uckelmann |
| 7,454,262 B2 | 11/2008 | Larsson et al. |
| 7,537,722 B2 | 5/2009 | Andersson et al. |
| 7,540,738 B2 | 6/2009 | Larsson et al. |
| 7,569,174 B2 | 8/2009 | Ruatta et al. |
| 7,635,825 B2 | 12/2009 | Larsson |
| 7,686,605 B2 | 3/2010 | Perret et al. |
| 7,696,501 B2 | 4/2010 | Jones |
| 7,713,454 B2 | 5/2010 | Larsson |
| 7,754,135 B2 | 7/2010 | Abe et al. |
| 7,799,253 B2 | 9/2010 | Höchsmann et al. |
| 7,871,551 B2 | 1/2011 | Wallgren et al. |
| 8,021,138 B2 | 9/2011 | Green |
| 8,083,513 B2 | 12/2011 | Montero-Escuder et al. |
| 8,137,739 B2 | 3/2012 | Philippi et al. |
| 8,187,521 B2 | 5/2012 | Larsson et al. |
| 8,308,466 B2 | 11/2012 | Ackelid et al. |
| 8,946,657 B2 * | 2/2015 | Apel ................ G21K 5/04 250/492.1 |
| 8,992,816 B2 | 3/2015 | Jonasson et al. |
| 9,073,265 B2 | 7/2015 | Snis |
| 9,079,248 B2 | 7/2015 | Ackelid |
| 9,126,167 B2 | 9/2015 | Ljungblad |
| 9,254,535 B2 | 2/2016 | Buller et al. |
| 9,310,188 B2 | 4/2016 | Snis |
| 9,505,172 B2 | 11/2016 | Ljungblad |
| 9,550,207 B2 | 1/2017 | Ackelid |
| 9,802,253 B2 | 10/2017 | Jonasson |
| 9,950,367 B2 | 4/2018 | Backlund et al. |
| 10,071,422 B2 | 9/2018 | Buller et al. |
| 2002/0104973 A1 | 8/2002 | Kerekes |
| 2002/0152002 A1 | 10/2002 | Lindemann et al. |
| 2002/0195747 A1 | 12/2002 | Hull et al. |
| 2003/0043360 A1 | 3/2003 | Farnworth |
| 2003/0133822 A1 | 7/2003 | Harryson |
| 2003/0205851 A1 | 11/2003 | Laschutza et al. |
| 2004/0012124 A1 | 1/2004 | Li et al. |
| 2004/0026807 A1 | 2/2004 | Andersson et al. |
| 2004/0084814 A1 | 5/2004 | Boyd et al. |
| 2004/0104499 A1 | 6/2004 | Keller |
| 2004/0148048 A1 | 7/2004 | Farnworth |
| 2004/0173496 A1 | 9/2004 | Srinivasan |
| 2004/0173946 A1 | 9/2004 | Pfeifer et al. |
| 2004/0204765 A1 | 10/2004 | Fenning et al. |
| 2004/0217095 A1 | 11/2004 | Herzog |
| 2005/0173380 A1 | 8/2005 | Carbone |
| 2005/0186538 A1 | 8/2005 | Uckelmann |
| 2005/0282300 A1 | 12/2005 | Yun et al. |
| 2006/0108712 A1 | 5/2006 | Mattes |
| 2006/0138325 A1 | 6/2006 | Choi |
| 2006/0145381 A1 | 7/2006 | Larsson |
| 2006/0147332 A1 | 7/2006 | Jones et al. |
| 2006/0157892 A1 | 7/2006 | Larsson |
| 2006/0180957 A1 | 8/2006 | Hopkinson et al. |
| 2006/0284088 A1 | 12/2006 | Fukunaga et al. |
| 2007/0074659 A1 | 4/2007 | Wahlstrom |
| 2007/0175875 A1 | 8/2007 | Uckelmann et al. |
| 2007/0179655 A1 | 8/2007 | Farnworth |
| 2007/0182289 A1 | 8/2007 | Kigawa et al. |
| 2007/0298182 A1 | 12/2007 | Perret et al. |
| 2008/0236738 A1 | 10/2008 | Lo et al. |
| 2009/0017219 A1 | 1/2009 | Paasche et al. |
| 2009/0152771 A1 | 6/2009 | Philippi et al. |
| 2009/0206056 A1 | 8/2009 | Xu et al. |
| 2010/0007062 A1 | 1/2010 | Larsson et al. |
| 2010/0260410 A1 | 10/2010 | Taminger et al. |
| 2010/0305743 A1 | 12/2010 | Larsson |
| 2010/0310404 A1 | 12/2010 | Ackelid |
| 2010/0316856 A1 | 12/2010 | Currie et al. |
| 2011/0061591 A1 | 3/2011 | Stecker |
| 2011/0114839 A1 | 5/2011 | Stecker et al. |
| 2011/0133367 A1 | 6/2011 | Weidinger et al. |
| 2011/0240607 A1 | 10/2011 | Stecker et al. |
| 2011/0241575 A1 | 10/2011 | Caiafa et al. |
| 2011/0293770 A1 | 12/2011 | Ackelid et al. |
| 2011/0293771 A1 | 12/2011 | Oberhofer et al. |

(56) References Cited

U.S. PATENT DOCUMENTS

| | | |
|---|---|---|
| 2011/0309554 A1 | 12/2011 | Liska et al. |
| 2011/0316178 A1 | 12/2011 | Uckelmann |
| 2012/0100031 A1 | 4/2012 | Ljungblad |
| 2012/0164322 A1 | 6/2012 | Teulet et al. |
| 2012/0183701 A1 | 7/2012 | Pilz et al. |
| 2012/0193530 A1 | 8/2012 | Parker et al. |
| 2012/0211155 A1 | 8/2012 | Wehning et al. |
| 2012/0223059 A1 | 9/2012 | Ackelid |
| 2012/0225210 A1 | 9/2012 | Fruth |
| 2012/0237745 A1 | 9/2012 | Dierkes et al. |
| 2012/0266815 A1 | 10/2012 | Brunermer |
| 2013/0055568 A1 | 3/2013 | Dusel et al. |
| 2013/0162134 A1 | 6/2013 | Mattausch et al. |
| 2013/0186514 A1 | 7/2013 | Zhuang et al. |
| 2013/0216959 A1 | 8/2013 | Tanaka et al. |
| 2013/0233846 A1 | 9/2013 | Jakimov et al. |
| 2013/0264750 A1 | 10/2013 | Hofacker et al. |
| 2013/0270750 A1 | 10/2013 | Green |
| 2013/0278920 A1 | 10/2013 | Loewgren |
| 2013/0300286 A1 | 11/2013 | Ljungblad et al. |
| 2013/0343947 A1 | 12/2013 | Satzger et al. |
| 2014/0175708 A1 | 6/2014 | Echigo et al. |
| 2014/0271964 A1 | 9/2014 | Roberts, IV et al. |
| 2014/0301884 A1 | 10/2014 | Hellestam et al. |
| 2014/0308153 A1 | 10/2014 | Ljungblad |
| 2014/0314609 A1 | 10/2014 | Ljungblad et al. |
| 2014/0314964 A1 | 10/2014 | Ackelid |
| 2014/0348691 A1 | 11/2014 | Ljungblad et al. |
| 2014/0363327 A1 | 12/2014 | Holcomb |
| 2014/0367367 A1 | 12/2014 | Wood et al. |
| 2015/0004045 A1 | 1/2015 | Ljungblad |
| 2015/0050463 A1 | 2/2015 | Nakano et al. |
| 2015/0071809 A1 | 3/2015 | Nordkvist et al. |
| 2015/0086409 A1 | 3/2015 | Hellestam |
| 2015/0088295 A1 | 3/2015 | Hellestam |
| 2015/0130118 A1 | 5/2015 | Cheng et al. |
| 2015/0139849 A1 | 5/2015 | Pialot, Jr. et al. |
| 2015/0151490 A1 | 6/2015 | Jonasson et al. |
| 2015/0165524 A1 | 6/2015 | Ljungblad et al. |
| 2015/0165525 A1 | 6/2015 | Jonasson |
| 2015/0174658 A1 | 6/2015 | Ljungblad |
| 2015/0174695 A1 | 6/2015 | Elfstroem et al. |
| 2015/0251249 A1 | 9/2015 | Fager |
| 2015/0270088 A1* | 9/2015 | Satoh ............ B23K 15/002 315/107 |
| 2015/0273622 A1 | 10/2015 | Manabe |
| 2015/0283610 A1 | 10/2015 | Ljungblad et al. |
| 2015/0283613 A1 | 10/2015 | Backlund et al. |
| 2015/0290710 A1 | 10/2015 | Ackelid |
| 2015/0306819 A1 | 10/2015 | Ljungblad |
| 2016/0052056 A1 | 2/2016 | Fager |
| 2016/0052079 A1 | 2/2016 | Ackelid |
| 2016/0054115 A1 | 2/2016 | Snis |
| 2016/0054121 A1 | 2/2016 | Snis |
| 2016/0054347 A1 | 2/2016 | Snis |
| 2016/0059314 A1 | 3/2016 | Ljungblad et al. |
| 2016/0129501 A1 | 5/2016 | Loewgren et al. |
| 2016/0167160 A1 | 6/2016 | Hellestam |
| 2016/0167303 A1 | 6/2016 | Petelet |
| 2016/0202042 A1 | 7/2016 | Snis |
| 2016/0202043 A1 | 7/2016 | Snis |
| 2016/0211116 A1 | 7/2016 | Lock |
| 2016/0236279 A1 | 8/2016 | Ashton et al. |
| 2016/0279735 A1 | 9/2016 | Hellestam |
| 2016/0282848 A1 | 9/2016 | Hellestam |
| 2016/0303687 A1 | 10/2016 | Ljungblad |
| 2016/0307731 A1 | 10/2016 | Lock |
| 2016/0311021 A1 | 10/2016 | Elfstroem et al. |
| 2017/0080494 A1 | 3/2017 | Ackelid |
| 2017/0087661 A1 | 3/2017 | Backlund et al. |
| 2017/0106443 A1 | 4/2017 | Karlsson |
| 2017/0106570 A1 | 4/2017 | Karlsson |
| 2017/0136541 A1 | 5/2017 | Fager |
| 2017/0136542 A1 | 5/2017 | Nordkvist et al. |
| 2017/0173691 A1 | 6/2017 | Jonasson |
| 2017/0189964 A1 | 7/2017 | Backlund et al. |
| 2017/0227417 A1 | 8/2017 | Snis |
| 2017/0227418 A1 | 8/2017 | Snis |
| 2017/0246684 A1 | 8/2017 | Hellestam |
| 2017/0246685 A1 | 8/2017 | Hellestam |
| 2017/0259338 A1 | 9/2017 | Ackelid |
| 2017/0282248 A1 | 10/2017 | Ljungblad et al. |
| 2017/0294288 A1 | 10/2017 | Lock |
| 2017/0341141 A1 | 11/2017 | Ackelid |
| 2017/0341142 A1 | 11/2017 | Ackelid |
| 2017/0348792 A1 | 12/2017 | Fager |
| 2018/0009033 A1 | 1/2018 | Fager |
| 2018/0154444 A1 | 6/2018 | Jonasson |

FOREIGN PATENT DOCUMENTS

| | | |
|---|---|---|
| CN | 101635210 A | 1/2010 |
| CN | 201693176 U | 1/2011 |
| CN | 101607311 B | 9/2011 |
| CN | 203509463 U | 4/2014 |
| DE | 19952998 A1 | 5/2001 |
| DE | 20305843 U1 | 7/2003 |
| DE | 10235434 A1 | 2/2004 |
| DE | 102005014483 A1 | 10/2006 |
| DE | 202008005417 UI | 8/2008 |
| DE | 102007018601 A1 | 10/2008 |
| DE | 102007029052 A1 | 1/2009 |
| DE | 102008012064 A1 | 9/2009 |
| DE | 102010041284 A1 | 3/2012 |
| DE | 102011105045 B3 | 6/2012 |
| DE | 102013210242 A1 | 12/2014 |
| EP | 0289116 A1 | 11/1988 |
| EP | 0322257 A2 | 6/1989 |
| EP | 0688262 A1 | 12/1995 |
| EP | 1358994 A1 | 11/2003 |
| EP | 1418013 A1 | 5/2004 |
| EP | 1466718 A2 | 10/2004 |
| EP | 1486318 A2 | 12/2004 |
| EP | 1669143 A1 | 6/2006 |
| EP | 1683593 A2 | 7/2006 |
| EP | 1721725 A1 | 11/2006 |
| EP | 1752240 A1 | 2/2007 |
| EP | 1952932 A2 | 8/2008 |
| EP | 2011631 A1 | 1/2009 |
| EP | 2119530 A1 | 11/2009 |
| EP | 2281677 A1 | 2/2011 |
| EP | 2289652 A1 | 3/2011 |
| EP | 2292357 A1 | 3/2011 |
| EP | 2832474 A1 | 2/2015 |
| FR | 2980380 A1 | 3/2013 |
| JP | H05-171423 A | 7/1993 |
| JP | 2003241394 A | 8/2003 |
| JP | 2003245981 | 9/2003 |
| JP | 2009006509 A | 1/2009 |
| SE | 524467 C2 | 8/2004 |
| WO | WO 1993/08928 A1 | 5/1993 |
| WO | WO 1996/012607 A1 | 5/1996 |
| WO | WO 1997/37523 A2 | 10/1997 |
| WO | WO 2001/081031 A1 | 11/2001 |
| WO | WO 2001/85386 A2 | 11/2001 |
| WO | WO 2002/008653 A1 | 1/2002 |
| WO | WO 2004/007124 A1 | 1/2004 |
| WO | WO 2004/043680 A2 | 5/2004 |
| WO | WO 2004/054743 A1 | 7/2004 |
| WO | WO 2004/056511 A1 | 7/2004 |
| WO | WO 2004/106041 A2 | 12/2004 |
| WO | WO 2004/108398 A1 | 12/2004 |
| WO | WO 2006/091097 A2 | 8/2006 |
| WO | WO 2006/121374 A1 | 11/2006 |
| WO | WO 2007/112808 A1 | 10/2007 |
| WO | WO 2007/147221 A1 | 12/2007 |
| WO | WO 2008/013483 A1 | 1/2008 |
| WO | WO 2008/057844 A1 | 5/2008 |
| WO | WO 2008/074287 A1 | 6/2008 |
| WO | WO 2008/125497 A1 | 10/2008 |
| WO | WO 2008/147306 A1 | 12/2008 |
| WO | WO 2009/000360 A1 | 12/2008 |
| WO | WO 2009/072935 A1 | 6/2009 |
| WO | WO 2009/084991 A1 | 7/2009 |

(56) References Cited

FOREIGN PATENT DOCUMENTS

| WO | WO 2010/095987 A1 | 8/2010 |
|----|-------------------|--------|
| WO | WO 2010/125371 A1 | 11/2010 |
| WO | WO 2011/008143 A1 | 1/2011 |
| WO | WO 2011/011818 A1 | 2/2011 |
| WO | WO 2011/030017 A1 | 3/2011 |
| WO | WO 2011/060312 A2 | 5/2011 |
| WO | WO 2012/102655 A1 | 8/2012 |
| WO | WO 2013/092997 A1 | 6/2013 |
| WO | WO 2013/098050 A1 | 7/2013 |
| WO | WO 2013/098135 A1 | 7/2013 |
| WO | WO 2013/159811 A1 | 10/2013 |
| WO | WO 2013/167194 A1 | 11/2013 |
| WO | WO 2013/178825 A2 | 12/2013 |
| WO | WO 2014/071968 A1 | 5/2014 |
| WO | WO 2014/092651 A1 | 6/2014 |
| WO | WO 2014/095200 A1 | 6/2014 |
| WO | WO 2014/095208 A1 | 6/2014 |
| WO | WO 2014/195068 A1 | 12/2014 |
| WO | WO 2015/032590 A2 | 3/2015 |
| WO | WO 2015/091813 A1 | 6/2015 |
| WO | WO 2015/120168 A1 | 8/2015 |
| WO | WO 2015/142492 A1 | 9/2015 |

OTHER PUBLICATIONS

Guibas, Leonidas J., et al., "Randomized Incremental Construction of Delaunay and Voronoi Diagrams", Algorithmica, Jun. 1992, pp. 381-413, vol. 7, Issue 1-6, Springer-Verlag, New York.

Weigel, Th., et al., "Design and Preparation of Polymeric Scaffolds for Tissue Engineering," Expert Rev. Med. Devices, 2006, pp. 835-851, vol. 3, No. 6, XP002691485.

Yang, et al., "The Design of Scaffolds for Use in Tissue Engineering, Part II, Rapid Prototyping Techniques", Tissue Engineering, 2002, pp. 1-11, vol. 8, No. 1, XP002691484.

Klassen, Alexander, et al., "Modelling of Electron Beam Absorption in Complex Geometries", *Journal of Physics D: Applied Physics*, Jan. 15, 2014, 12 pages, vol. 47, No. 6, Institute of Physics Publishing Ltd., Great Britain.

Gibson, D.W., et al., "Additive Manufacturing Technologies: Rapid Prototyping to Direct Digital Manufacturing", 2010, pp. 126-129, Springer, New York.

Motojima, Seiji, et al., "Chemical Vapor Growth of LaB6 Whiskers and Crystals Having a Sharp Tip", Journal of Crystal Growth, vol. 44, No. 1, Aug. 1, 1978 (Aug. 1, 1978), pp. 106-109.

\* cited by examiner

ADDITIVE MANUFACTURING OF THREE-DIMENSIONAL ARTICLES

CROSS-REFERENCE TO RELATED APPLICATIONS

This application claims priority to and the benefit of U.S. Provisional patent application Ser. No. 62/344,051, filed Jun. 1, 2016, the contents of which as are hereby incorporated by reference in their entirety.

BACKGROUND

Related Field

The present invention relates to a method and apparatus for additive manufacturing of a three dimensional article by successively fusing individual layers of powder material.

Description of Related Art

Freeform fabrication or additive manufacturing is a method for forming three-dimensional articles through successive fusion of chosen parts of powder layers applied to a worktable.

An additive manufacturing apparatus may comprise a work table on which the three-dimensional article is to be formed, a powder dispenser or powder distributor, arranged to lay down a thin layer of powder on the work table for the formation of a powder bed, a high energy beam for delivering energy to the powder whereby fusion of the powder takes place, elements for control of the energy given off by the energy beam over the powder bed for the formation of a cross section of the three-dimensional article through fusion of parts of the powder bed, and a controlling computer, in which information is stored concerning consecutive cross sections of the three-dimensional article. A three-dimensional article is formed through consecutive fusions of consecutively formed cross sections of powder layers, successively laid down by the powder dispenser.

In additive manufacturing a short manufacturing time and high quality of the finalized product is of outmost importance. Desired material properties of the final product may depend on the ability to control the fusion process.

EBM (Electron Beam Melting) is one type of additive manufacturing where an electron emitting cathode in an electron acceleration column is the source for electron beam generation which in turn is acting as an energy beam for melting the power material. One problem is that the cathode, as well as control electronics connected to the Wehnelt cup is very sensitive to high discharge currents which may occur in an EBM machine. The discharge current is a result of vacuum arc discharges that is triggered by contamination particles that bridges the electric acceleration field between the cathode and an anode. The contamination particles may be material evaporated from the fusion process and/or contamination particles present in the vacuum chamber for other reasons. The discharge currents may destroy the cathode element and/or the Wehnelt cup electronics which in turn stops the additive manufacturing process.

BRIEF SUMMARY

An object of the invention is to provide a method and apparatus which prohibits that discharge currents will destroy the cathode element and/or the Wehnelt cup electronics in an EBM additive manufacturing machine. This object is achieved by the features in the claims provided herein.

In a first aspect of the invention it is provided a method for forming a three-dimensional article through successively depositing individual layers of powder material that are fused together so as to form the article, the method comprising the steps of: providing at least one electron beam source emitting an electron beam for at least one of heating or fusing the powder material, where the electron beam source comprises a cathode, an anode, and a Wehnelt cup between the cathode and anode; providing a guard ring between the Wehnelt cup and the anode and in close proximity to the Wehnelt cup, where the guard ring is having an aperture which is larger than an aperture of the Wehnelt cup; and protecting the cathode and/or the Wehnelt cup against vacuum arc discharge energy currents when forming the three-dimensional article by providing the guard ring with a higher negative potential than the Wehnelt cup and cathode.

An exemplary and non-limiting advantage of the present invention is that the cathode and electronics connected to the cathode and/or Wehnelt cup is protected from vacuum arc discharge currents which may greatly improve the reliability of the additive manufacturing process.

In various example embodiments of the present invention the the guard ring potential is fixed with reference to cathode potential. An exemplary advantage of this embodiment is that it is simple and inexpensive to implement.

In various example embodiments of the present invention the guard ring potential is synchronized with the grid cup potential so that the guard ring potential is always 200-400V more negative than the grid cup potential. An exemplary advantage of this embodiment is that any influence of the guard ring potential is equal for all electron beam currents.

In various example embodiments of the present invention the guard ring is connected to an electric circuit dedicated to maintain the fixed guard ring potential during the vacuum arc discharge. An exemplary advantage of this embodiment is that it prevents the vacuum arc discharge to switch from the guard ring to the cathode and/or the Whenelt cup after a certain time period during the vacuum arc discharge. The electric circuit may in its simplest form be a capacitor with a sufficiently large capacitance.

In various example embodiments of the present invention the method further comprising the step of aligning a center of an aperture in the Wehnelt cup with a center of an aperture in the guard ring. An exemplary advantage of this embodiment is that the guard ring will affect the electron beam equally in all directions.

In another aspect of the present invention it is provided a program element configured and arranged when executed on a computer to implement a method for forming a three-dimensional article through successively depositing individual layers of powder material that are fused together so as to form the article, the method comprising the steps of: providing at least one electron beam source emitting an electron beam for at least one of heating or fusing the powder material, where the electron beam source comprises a cathode, an anode, and a Wehnelt cup between the cathode and anode; providing a guard ring between the Wehnelt cup and the anode and in close proximity to the Wehnelt cup, where the guard ring is having an aperture which is larger than an aperture of the Wehnelt cup; wherein the guard ring is provided with a higher negative potential than the Wehnelt cup and the cathode for protecting the cathode and/or the Wehnelt cup against vacuum arc discharge energy currents when forming the three-dimensional article.

In another aspect of the present invention it is provided a computer program product comprising at least one non-transitory computer-readable storage medium having computer-readable program code portions embodied therein, the computer-readable program code portions comprising at least one executable portion configured for: providing at least one electron beam source emitting an electron beam for at least one of heating or fusing the powder material, wherein the electron beam source comprises a cathode, an anode, and a Wehnelt cup positioned between the cathode and anode; providing a guard ring between the Wehnelt cup and the anode and in close proximity to the Wehnelt cup, wherein the guard ring has an aperture larger than an aperture of the Wehnelt cup; and protecting the cathode and/or the Wehnelt cup against vacuum arc discharge energy currents when forming the three-dimensional article by providing the guard ring with a higher negative potential than a negative potential of the Wehnelt cup and the cathode.

In still another aspect of the present invention it is provided an additive manufacturing apparatus for forming a three-dimensional article through successive fusion of parts of at least one layer of powder provided on a work table, which parts corresponds to successive cross sections of the three dimensional article, the apparatus comprises at least one electron beam source emitting an electron beam for at least one of heating or fusing the powder material, where the electron beam source comprises a cathode, an anode, and a Wehnelt cup between the cathode and anode; a guard ring is provided between the Wehnelt cup and the anode and in close proximity to the Wehnelt cup, where the guard ring is having an aperture which is larger than an aperture of the Wehnelt cup, wherein the guard ring is provided with a higher negative potential than the Wehnelt cup for protecting the cathode and/or the Wehnelt cup against vacuum arc discharge energy currents when forming the three-dimensional article.

All examples and exemplary embodiments described herein are non-limiting in nature and thus should not be construed as limiting the scope of the invention described herein. Still further, the advantages described herein, even where identified with respect to a particular exemplary embodiment, should not be necessarily construed in such a limiting fashion.

BRIEF DESCRIPTION OF THE SEVERAL VIEWS OF THE DRAWINGS

Figure 1:
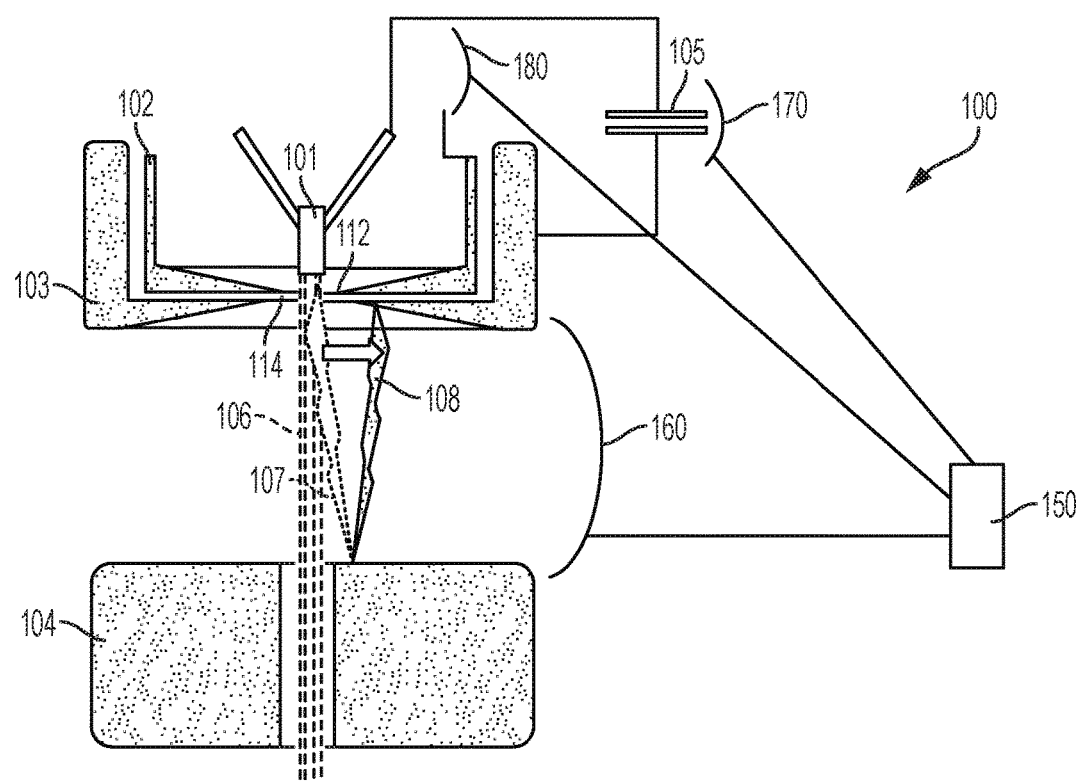
Figure 2:
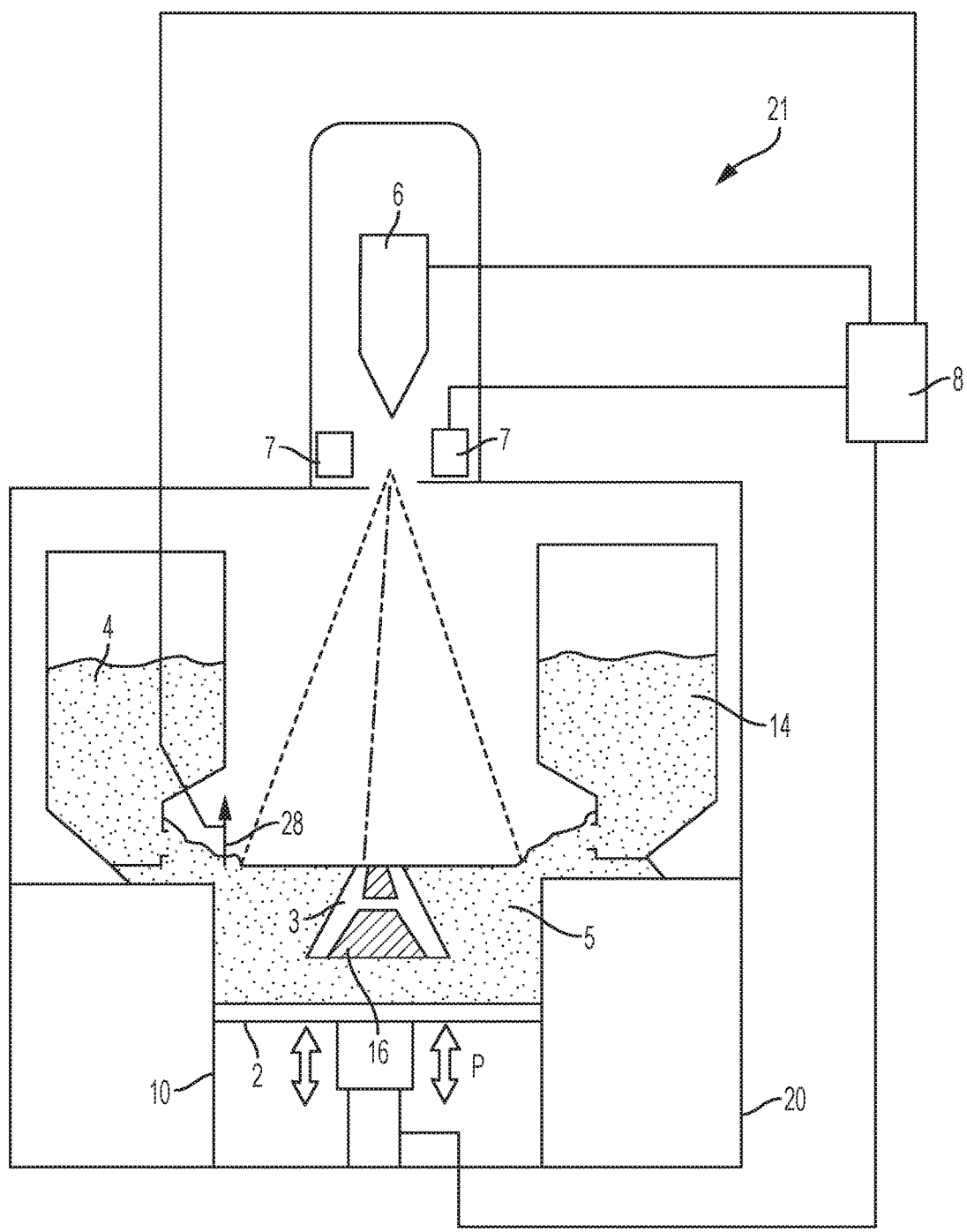
Figure 3:
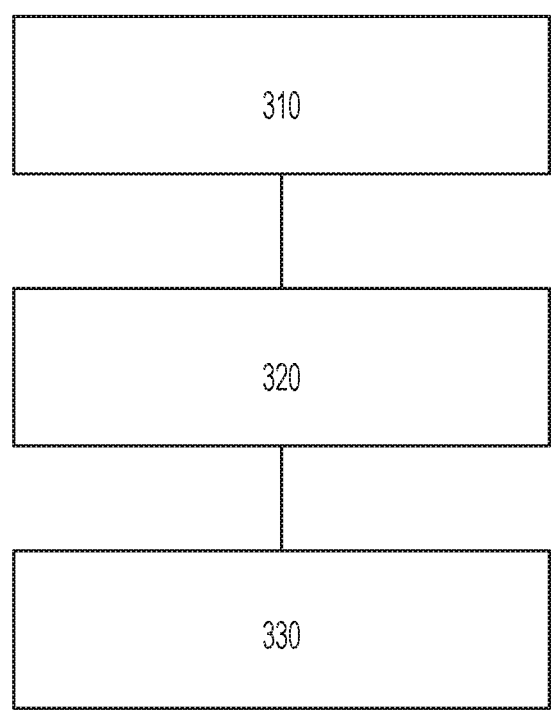

Having thus described the invention in general terms, reference will now be made to the accompanying drawings, which are not necessarily drawn to scale, and wherein:

FIG. 1 depicts, in a schematic cross sectional side view, an example embodiment of an electron beam source according to the present invention;

FIG. 2 depicts, in a schematic view, an example embodiment of an apparatus for producing a three dimensional product which may have an electron beam source according to FIG. 1;

FIG. 3 depicts a schematic flow chart of an example embodiment of the method according to the present invention.

Figure 4:
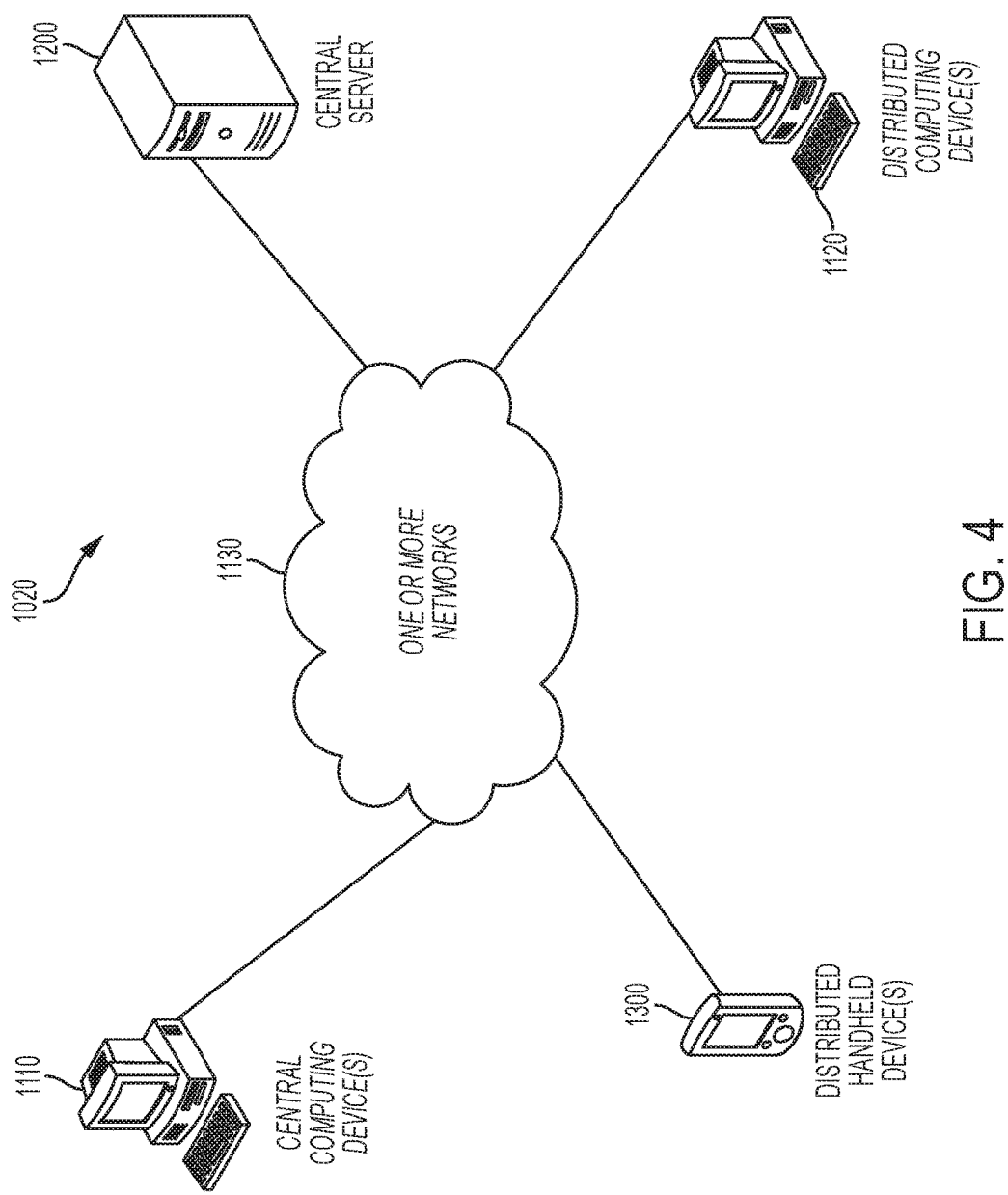
Figure 5A:
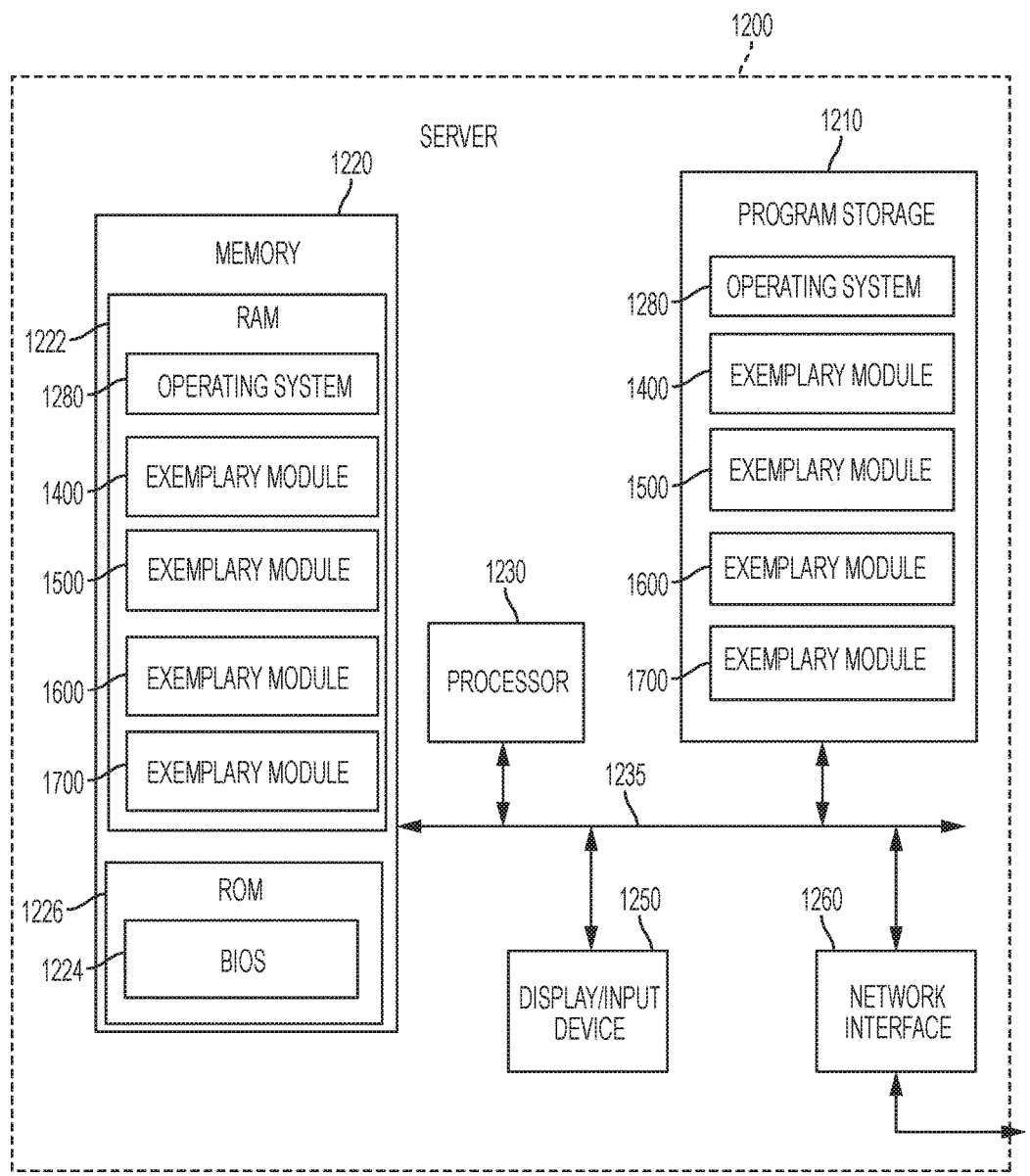
Figure 5B:
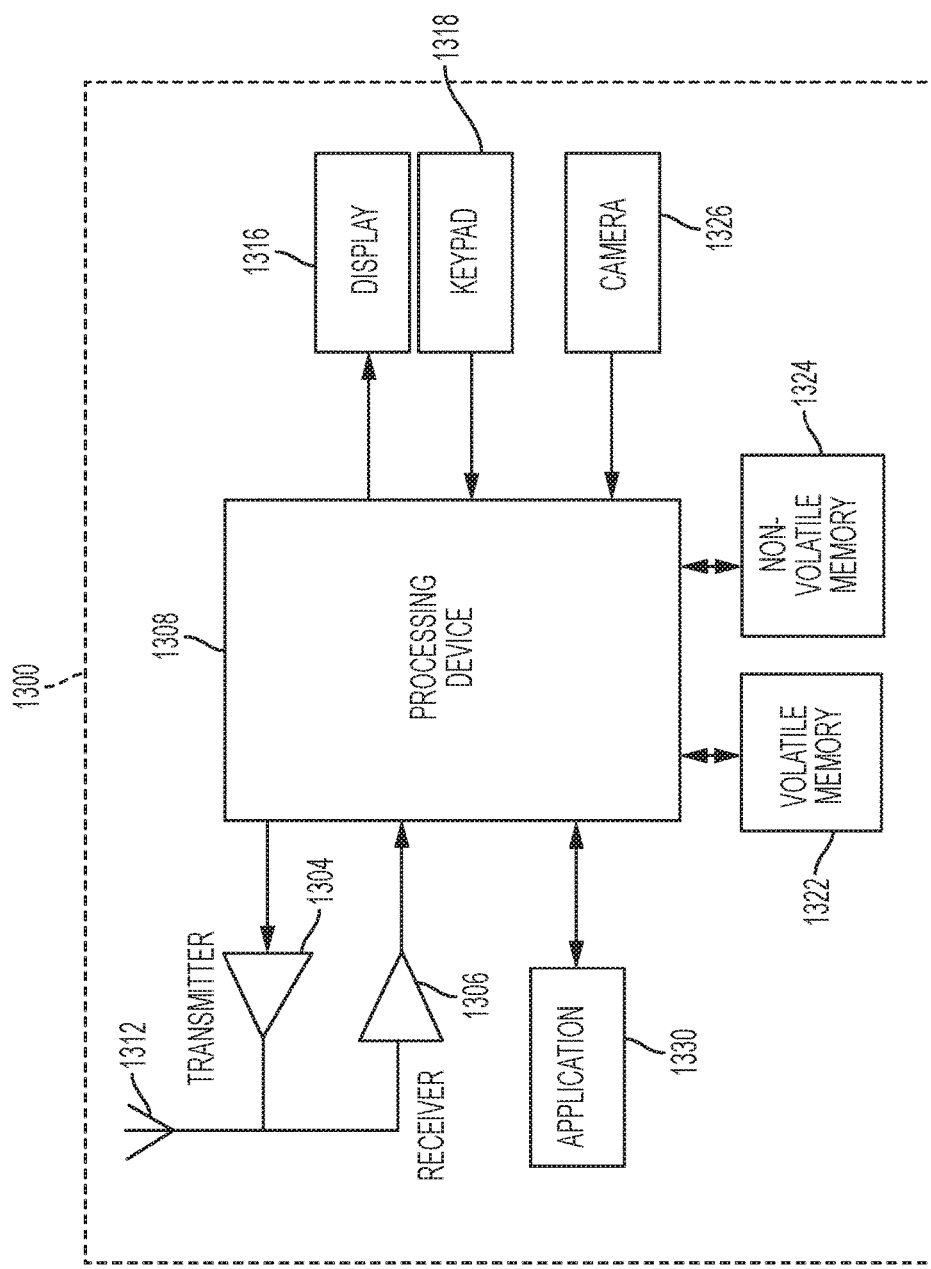

FIG. 4 is a block diagram of an exemplary system 1020 according to various embodiments;

FIG. 5A is a schematic block diagram of a server 1200 according to various embodiments; and FIG. 5B is a schematic block diagram of an exemplary mobile device 1300 according to various embodiments.

DETAILED DESCRIPTION OF VARIOUS EMBODIMENTS

Various embodiments of the present invention will now be described more fully hereinafter with reference to the accompanying drawings, in which some, but not all embodiments of the invention are shown. Indeed, embodiments of the invention may be embodied in many different forms and should not be construed as limited to the embodiments set forth herein. Rather, these embodiments are provided so that this disclosure will satisfy applicable legal requirements. Unless otherwise defined, all technical and scientific terms used herein have the same meaning as commonly known and understood by one of ordinary skill in the art to which the invention relates. The term "or" is used herein in both the alternative and conjunctive sense, unless otherwise indicated. Like numbers refer to like elements throughout.

Still further, to facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

The term "three-dimensional structures" and the like as used herein refer generally to intended or actually fabricated three-dimensional configurations (e.g., of structural material or materials) that are intended to be used for a particular purpose. Such structures, etc. may, for example, be designed with the aid of a three-dimensional CAD system.

The term "electron beam" as used herein in various embodiments refers to any charged particle beam. The sources of charged particle beam can include an electron gun, a linear acceleration and so on.

The terms "Wehnelt cup" and "grid cup" have the same meaning and are used interchangeably in this document.

FIG. 2 depicts an embodiment of a freeform fabrication or additive manufacturing apparatus 21 in which the inventive method according to the present invention may be implemented.

The apparatus 21 comprising an electron beam gun 6; deflection coils 7; two powder hoppers 4, 14; a build platform 2; a build tank 10; a powder distributor 28; a powder bed 5; and a vacuum chamber 20.

The vacuum chamber 20 is capable of maintaining a vacuum environment via a vacuum system, which system may comprise a turbo molecular pump, a scroll pump, an ion pump and one or more valves which are well known to a skilled person in the art and therefore need no further explanation in this context. The vacuum system is controlled by a control unit 8.

The electron beam gun 6 is generating an electron beam which is used for pre heating of the powder, melting or fusing together powder material provided on the build platform 2 or post heat treatment of the already fused powder material. At least a portion of the electron beam gun 6 may be provided in the vacuum chamber 20. The control unit 8 may be used for controlling and managing the electron beam emitted from the electron beam gun 6. At least one focusing coil (not shown), at least one deflection coil 7, an optional coil for astigmatic correction (not shown) and an electron beam power supply (not shown) may be electrically connected to the control unit 8. In an example embodiment of the invention the electron beam gun 6 may generate a focusable electron beam with an accelerating voltage of about 15-60 kV and with a beam power in the range of 3-10 kW. The pressure in the vacuum chamber may be $10^{-3}$ mbar or lower when building the three-dimensional article by fusing the powder layer by layer with the energy beam.

The powder hoppers 4, 14 comprise the powder material to be provided on the build platform 2 in the build tank 10. The powder material may for instance be pure metals or metal alloys such as titanium, titanium alloys, aluminum, aluminum alloys, stainless steel, Co—Cr alloys, nickel based super alloys, etc.

The powder distributor 28 is arranged to lay down a thin layer of the powder material on the build platform 2. During a work cycle the build platform 2 will be lowered successively in relation to a fixed point in the vacuum chamber. In order to make this movement possible, the build platform 2 is in one embodiment of the invention arranged movably in vertical direction, i.e., in the direction indicated by arrow P. This means that the build platform 2 starts in an initial position, in which a first powder material layer of necessary thickness has been laid down. Means for lowering the build platform 2 may for instance be through a servo motor equipped with a gear, adjusting screws, etc. The servo motor may be connected to the control unit 8.

An electron beam may be directed over the build platform 2 causing the first powder layer to fuse in selected locations to form a first cross section of the three-dimensional article 3. The beam is directed over the build platform 2 from instructions given by the control unit 8. In the control unit 8 instructions for how to control the electron beam for each layer of the three-dimensional article is stored. The first layer of the three dimensional article 3 may be built on the build platform 2, which may be removable, in the powder bed 5 or on an optional start plate 16. The start plate 16 may be arranged directly on the build platform 2 or on top of a powder bed 5 which is provided on the build platform 2.

After a first layer is finished, i.e., the fusion of powder material for making a first layer of the three-dimensional article, a second powder layer is provided on the build platform 2. The thickness of the second layer may be determined by the distance the build platform is lowered in relation to the position where the first layer was built. The second powder layer is in various embodiments distributed according to the same manner as the previous layer. However, there might be alternative methods in the same additive manufacturing machine for distributing powder onto the work table. For instance, a first layer may be provided via a first powder distributor 28, a second layer may be provided by another powder distributor. The design of the powder distributor is automatically changed according to instructions from the control unit 8. A powder distributor 28 in the form of a single rake system, i.e., where one rake is catching powder fallen down from both a left powder hopper 4 and a right powder hopper 14, the rake as such can change design.

After having distributed the second powder layer on the build platform, the energy beam is directed over the work table causing the second powder layer to fuse in selected locations to form a second cross section of the three-dimensional article. Fused portions in the second layer may be bonded to fused portions of the first layer. The fused portions in the first and second layer may be melted together by melting not only the powder in the uppermost layer but also remelting at least a fraction of a thickness of a layer directly below the uppermost layer.

Sometimes it may be necessary to consider the charge distribution that is created in the powder as the electrons hit the powder bed 5. The charge distribution density depends on the following parameters: beam current, electron velocity (which is given by the accelerating voltage), beam scanning velocity, powder material and electrical conductivity of the powder, i.e., mainly the electrical conductivity between the powder grains. The latter is in turn a function of several parameters, such as the non-limiting examples of temperature, degree of sintering and powder grain size/size distribution.

Thus, for a given powder, i.e., a powder of a certain material with a certain grain size distribution, and a given accelerating voltage, it is possible, by varying the beam current (and thus the beam power) and the beam scanning velocity, to affect the charge distribution.

By varying these parameters in a controlled way, the electrical conductivity of the powder can gradually be increased by increasing the temperature of the powder. A powder that has a high temperature obtains a considerably higher conductivity which results in a lower density of the charge distribution since the charges quickly can diffuse over a large region. This effect is enhanced if the powder is allowed to be slightly sintered during a pre-heating process. When the conductivity has become sufficiently high, the powder can be fused together, i.e., melted or fully sintered, with predetermined values of the beam current and beam scanning velocity.

FIG. 1 depicts, in a schematic cross sectional side view, an example embodiment of an electron beam source 100 according to the present invention. The electron beam source 100 comprises a cathode 101, a grid cup or Wehnelt cup 102, a guard ring 103 and an anode 104. Electrons 106 emitted at the cathode 101 being on negative potential are accelerated towards the anode 104 and finally a target surface. The grid cup 102 is set at a predetermined distance from the cathode 101. The cathode 101 may be provided with a separate power supply which may be used to heat the cathode, where upon the cathode 101 releases electrons by thermionic emission.

An acceleration voltage 160 is provided between the cathode 101 and the anode 104. The acceleration voltage 160 causes the emitted electrons from the cathode 101 to accelerate towards the anode 104 thus establishing an electron beam 106. The electron beam 106 may impinge on a substrate surface, which may be a powder layer in an additive manufacturing process. In order to guide and focus the electron beam there may further be arranged at least one focusing coil and at least one deflection coil.

In the electron beam source 100 the grid cup 102 is provided between the cathode 101 and the anode 104. The grid cup 102 may be arranged as a plate having an aperture 112. The aperture 112 may be aligned with the cathode 101. The size of the aperture 112 in the grid cup 102 may correspond to a cross section of the electron beam 106 at the position of the grid cup 102.

A grid cup voltage 180 may be provided between the grid cup 102 and the cathode 101 and may be adjusted between a negative blocking voltage and a full power voltage and thereby adjusting an electron beam current between 0-maximum electron beam current. In FIG. 1 the cathode 101 may be provided with a negative potential of −20 kV to −100 kV.

The grid cup voltage 180 may be varied between the negative blocking voltage and the full power voltage. A second control unit 150 may be controlling the grid cup voltage 180 in order to adjust the electron beam current to a desired value as well as the acceleration voltage 160 and a guard ring voltage 170. The second control unit 150 may be a physically separate control unit in connection with the control unit 8 or fully integrated in the control unit 8.

The anode may be set to ground potential. The target surface 118 may be set to ground potential or a positive potential. The electron beam source 100 may also comprise means for detecting the actual electron beam current. An example means for detecting the electron beam current on the target surface may be to detect the actual loading of the high voltage source providing the acceleration voltage 160. If the cathode is provided with a fixed negative voltage of −60 kV the negative blocking voltage may be around −61 kV, i.e., the Wehnelt cup 102 itself is set at −61 kV, for blocking the electrons by the grid cup 102. If starting to decrease the negative blocking voltage, some of the electrons emitted from the cathode will be allowed to pass through the grid cup 102. By varying the grid cup voltage in this example embodiment between −61 kV to ~−60 kV, when the cathode is provided with a fixed negative potential of −60 kV, the electron beam current may vary from OmA—maximum electron beam current which may be 25 mA for a predetermined size and shape of the cathode 101 and a predetermined size and shape of the aperture in the grid cup 102. Other acceleration voltages and/or other size, shape and emissivity of the cathode 101 and/or other size and shape of the aperture in the grid cup 102 may affect the maximum electron beam current to be higher or lower than the exemplified 25 mA.

The guard ring 103 may be arranged between the Wehnelt cup 102 and the anode 104 and in close proximity to the Wehnelt cup 102. The guard ring 103 may be provided with more negative potential than the Wehnelt cup 102 in order to diverge vacuum discharge arcs from the cathode 101 and/or Wehnelt cup 102 towards and onto the guard ring 103. In FIG. 1 a pre-discharge channel 107 may be present between the anode 104 and the cathode 101 if no guard ring 103 is present. However, a diverted discharge channel 108 between the anode 104 and the guard ring 103 may be present if the guard ring 103 is arranged with a more negative electric potential than the Wehnelt cup 102. A guard ring potential 170 may be fixed and connected to a bulk capacitance 105 of sufficient size to maintain its relative voltage to the Wehnelt cup 102 and cathode 101 during any possible vacuum discharge. The guard ring potential 170 is what controls the electric field strength that attracts and diverges the developing pre-discharge arc channel 107 from the anode 104 to the cathode 101 and/or Wehnelt cup 102 into a diverted discharge channel 108 from the anode 104 to the guard ring 103.

A guard ring aperture 114 needs to be somewhat larger than the Wehnelt cup aperture 112 in order not to interfere with the electric field controlling the electron emission from the cathode 101. In an example embodiment the aperture 114 in the guard ring 103 may be 10% larger than the aperture 112 of the Wehnelt cup 102. In an example embodiment the Wehnelt cup 102 may have an aperture 112 of 3 mm and the guard ring 103 may have an aperture 114 of 3.3 mm.

If the grid cup potential is varied between −61 kV−−60 kV the guard ring potential needs to be around −61.5 kV if set to a fixed value. Alternatively the guard ring potential 170 may by synchronized with the grid cup potential 180 and may always being set to a potential −200−−400 lower than the grid cup potential 180.

The distance between the Guard ring and the Wehnelt cup in a direction towards the anode 104 may be a few mm.

FIG. 3 depicts a schematic flow chart of an example embodiment of the method for forming a three-dimensional article through successively depositing individual layers of powder material that are fused together so as to form the article.

In a first step 310 at least one electron beam source is provided for emitting an electron beam for at least one of heating or fusing the powder material, where the electron beam source comprises a cathode, an anode, and a Wehnelt cup between the cathode and anode.

In a second step 320 a guard ring is provided between the Wehnelt cup and the anode and in close proximity to the Wehnelt cup, where the guard ring is having an aperture which is larger than an aperture of the Wehnelt cup.

In a third step 330 the cathode and/or the Wehnelt cup is protected against vacuum arc discharge energy currents when forming the three-dimensional article by providing the guard ring with a higher negative potential than the Wehnelt cup and cathode.

In another aspect of the invention it is provided a program element configured and arranged when executed on a computer to implement a method for forming a three-dimensional article through successively depositing individual layers of powder material that are fused together so as to form the article, the method comprising the steps of: providing at least one electron beam source emitting an electron beam for heating and/or fusing the powder material, where the electron beam source comprising a cathode, an anode, and a grid cup between the cathode and anode, controlling the electron beam source in a first mode when the formation of the three dimensional article is in a first process step, controlling the electron beam source in a second mode when the formation of the three dimensional article is in a second process step, wherein an electron beam current from the electron beam source is controlled in a feed-forward mode in the first mode and the electron beam current is controlled in a feed-back mode in the second mode. The program may be installed in a computer readable storage medium. The computer readable storage medium may be the control unit 8, the control unit 150, or another separate and distinct control unit. The computer readable storage medium and the program element, which may comprise computer-readable program code portions embodied therein, may further be contained within a non-transitory computer program product. Further details regarding these features and configurations are provided, in turn, below.

As mentioned, various embodiments of the present invention may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. A non-volatile computer-readable storage medium may also include a punch card, paper tape, optical mark sheet (or any other physical medium with patterns of holes or other optically recognizable indicia), compact disc read only memory (CD-ROM), compact disc compact disc-rewritable (CD-RW), digital versatile disc (DVD), Blu-ray disc (BD), any other non-transitory optical medium, and/or the like. Such a non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like. Further, a non-volatile computer-readable storage medium may also include conductive-bridging random access memory (CBRAM), phase-change random access memory (PRAM), ferroelectric random-access memory (Fe-RAM), non-volatile random-access memory (NVRAM), magnetoresistive random-access memory (MRAM), resistive random-access memory (RRAM), Silicon-Oxide-Nitride-Oxide-Silicon memory (SONOS), floating junction gate random access memory (FJG RAM), Millipede memory, racetrack memory, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), Rambus dynamic random access memory (RDRAM), Twin Transistor RAM (TTRAM), Thyristor RAM (T-RAM), Zero-capacitor (Z-RAM), Rambus in-line memory module (RIMM), dual in-line memory module (DIMM), single in-line memory module (SIMM), video random access memory VRAM, cache memory (including various levels), flash memory, register memory, and/or the like. It will be appreciated that where embodiments are described to use a computer-readable storage medium, other types of computer-readable storage media may be substituted for or used in addition to the computer-readable storage media described above.

As should be appreciated, various embodiments of the present invention may also be implemented as methods, apparatus, systems, computing devices, computing entities, and/or the like, as have been described elsewhere herein. As such, embodiments of the present invention may take the form of an apparatus, system, computing device, computing entity, and/or the like executing instructions stored on a computer-readable storage medium to perform certain steps or operations. However, embodiments of the present invention may also take the form of an entirely hardware embodiment performing certain steps or operations.

Various embodiments are described below with reference to block diagrams and flowchart illustrations of apparatuses, methods, systems, and computer program products. It should be understood that each block of any of the block diagrams and flowchart illustrations, respectively, may be implemented in part by computer program instructions, e.g., as logical steps or operations executing on a processor in a computing system. These computer program instructions may be loaded onto a computer, such as a special purpose computer or other programmable data processing apparatus to produce a specifically-configured machine, such that the instructions which execute on the computer or other programmable data processing apparatus implement the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the functionality specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide operations for implementing the functions specified in the flowchart block or blocks.

Accordingly, blocks of the block diagrams and flowchart illustrations support various combinations for performing the specified functions, combinations of operations for performing the specified functions and program instructions for performing the specified functions. It should also be understood that each block of the block diagrams and flowchart illustrations, and combinations of blocks in the block diagrams and flowchart illustrations, could be implemented by special purpose hardware-based computer systems that perform the specified functions or operations, or combinations of special purpose hardware and computer instructions.

FIG. 4 is a block diagram of an exemplary system 1020 that can be used in conjunction with various embodiments of the present invention. In at least the illustrated embodiment, the system 1020 may include one or more central computing devices 1110, one or more distributed computing devices 1120, and one or more distributed handheld or mobile devices 1300, all configured in communication with a central server 1200 (or control unit) via one or more networks 1130. While FIG. 4 illustrates the various system entities as separate, standalone entities, the various embodiments are not limited to this particular architecture.

According to various embodiments of the present invention, the one or more networks 1130 may be capable of supporting communication in accordance with any one or more of a number of second-generation (2 G), 2.5 G, third-generation (3 G), and/or fourth-generation (4 G) mobile communication protocols, or the like. More particularly, the one or more networks 1130 may be capable of supporting communication in accordance with 2 G wireless communication protocols IS-136 (TDMA), GSM, and IS-95 (CDMA). Also, for example, the one or more networks 1130 may be capable of supporting communication in accordance with 2.5 G wireless communication protocols GPRS, Enhanced Data GSM Environment (EDGE), or the like. In addition, for example, the one or more networks 1130 may be capable of supporting communication in accordance with 3 G wireless communication protocols such as Universal Mobile Telephone System (UMTS) network employing Wideband Code Division Multiple Access (WCDMA) radio access technology. Some narrow-band AMPS (NAMPS), as well as TACS, network(s) may also benefit from embodiments of the present invention, as should dual or higher mode mobile stations (e.g., digital/analog or TDMA/CDMA/analog phones). As yet another example, each of the components of the system 1020 may be configured to communicate with one another in accordance with techniques such as, for example, radio frequency (RF), Bluetooth™ infrared (IrDA), or any of a number of different wired or wireless networking techniques, including a wired or wireless Personal Area Network ("PAN"), Local Area Network ("LAN"), Metropolitan Area Network ("MAN"), Wide Area Network ("WAN"), or the like.

Although the device(s) 1110-1300 are illustrated in FIG. 4 as communicating with one another over the same network 1130, these devices may likewise communicate over multiple, separate networks.

According to one embodiment, in addition to receiving data from the server 1200, the distributed devices 1110, 1120, and/or 1300 may be further configured to collect and transmit data on their own. In various embodiments, the devices 1110, 1120, and/or 1300 may be capable of receiving data via one or more input units or devices, such as a keypad, touchpad, barcode scanner, radio frequency identification (RFID) reader, interface card (e.g., modem, etc.) or receiver. The devices 1110, 1120, and/or 1300 may further be capable of storing data to one or more volatile or non-volatile memory modules, and outputting the data via one or more output units or devices, for example, by displaying data to the user operating the device, or by transmitting data, for example over the one or more networks 1130.

In various embodiments, the server 1200 includes various systems for performing one or more functions in accordance with various embodiments of the present invention, including those more particularly shown and described herein. It should be understood, however, that the server 1200 might include a variety of alternative devices for performing one or more like functions, without departing from the spirit and scope of the present invention. For example, at least a portion of the server 1200, in certain embodiments, may be located on the distributed device(s) 1110, 1120, and/or the handheld or mobile device(s) 1300, as may be desirable for particular applications. As will be described in further detail below, in at least one embodiment, the handheld or mobile device(s) 1300 may contain one or more mobile applications 1330 which may be configured so as to provide a user interface for communication with the server 1200, all as will be likewise described in further detail below.

FIG. 5A is a schematic diagram of the server 1200 according to various embodiments. The server 1200 includes a processor 1230 that communicates with other elements within the server via a system interface or bus 1235. Also included in the server 1200 is a display/input device 1250 for receiving and displaying data. This display/input device 1250 may be, for example, a keyboard or pointing device that is used in combination with a monitor. The server 1200 further includes memory 1220, which preferably includes both read only memory (ROM) 1226 and random access memory (RAM) 1222. The server's ROM 1226 is used to store a basic input/output system 1224 (BIOS), containing the basic routines that help to transfer information between elements within the server 1200. Various ROM and RAM configurations have been previously described herein.

In addition, the server 1200 includes at least one storage device or program storage 210, such as a hard disk drive, a floppy disk drive, a CD Rom drive, or optical disk drive, for storing information on various computer-readable media, such as a hard disk, a removable magnetic disk, or a CD-ROM disk. As will be appreciated by one of ordinary skill in the art, each of these storage devices 1210 are connected to the system bus 1235 by an appropriate interface. The storage devices 1210 and their associated computer-readable media provide nonvolatile storage for a personal computer. As will be appreciated by one of ordinary skill in the art, the computer-readable media described above could be replaced by any other type of computer-readable media known in the art. Such media include, for example, magnetic cassettes, flash memory cards, digital video disks, and Bernoulli cartridges.

Although not shown, according to an embodiment, the storage device 1210 and/or memory of the server 1200 may further provide the functions of a data storage device, which may store historical and/or current delivery data and delivery conditions that may be accessed by the server. In this regard, the storage device 1210 may comprise one or more databases. The term "database" refers to a structured collection of records or data that is stored in a computer system, such as via a relational database, hierarchical database, or network database and as such, should not be construed in a limiting fashion.

A number of program modules (e.g., exemplary modules 1400-1700) comprising, for example, one or more computer-readable program code portions executable by the processor 1230, may be stored by the various storage devices 1210 and within RAM 1222. Such program modules may also include an operating system 1280. In these and other embodiments, the various modules 1400, 1500, 1600, 1700 control certain aspects of the operation of the server 1200 with the assistance of the processor 1230 and operating system 1280. In still other embodiments, it should be understood that one or more additional and/or alternative modules may also be provided, without departing from the scope and nature of the present invention.

In various embodiments, the program modules 1400, 1500, 1600, 1700 are executed by the server 1200 and are configured to generate one or more graphical user interfaces, reports, instructions, and/or notifications/alerts, all accessible and/or transmittable to various users of the system 1020. In certain embodiments, the user interfaces, reports, instructions, and/or notifications/alerts may be accessible via one or more networks 1130, which may include the Internet or other feasible communications network, as previously discussed.

In various embodiments, it should also be understood that one or more of the modules 1400, 1500, 1600, 1700 may be alternatively and/or additionally (e.g., in duplicate) stored locally on one or more of the devices 1110, 1120, and/or 1300 and may be executed by one or more processors of the same. According to various embodiments, the modules 1400, 1500, 1600, 1700 may send data to, receive data from, and utilize data contained in one or more databases, which may be comprised of one or more separate, linked and/or networked databases.

Also located within the server 1200 is a network interface 1260 for interfacing and communicating with other elements of the one or more networks 1130. It will be appreciated by one of ordinary skill in the art that one or more of the server 1200 components may be located geographically remotely from other server components. Furthermore, one or more of the server 1060 components may be combined, and/or additional components performing functions described herein may also be included in the server.

While the foregoing describes a single processor 1230, as one of ordinary skill in the art will recognize, the server 1200 may comprise multiple processors operating in conjunction with one another to perform the functionality described herein. In addition to the memory 1220, the processor 1230 can also be connected to at least one interface or other means for displaying, transmitting and/or receiving data, content or the like. In this regard, the interface(s) can include at least one communication interface or other means for transmitting and/or receiving data, content or the like, as well as at least one user interface that can include a display and/or a user input interface, as will be described in further detail below. The user input interface, in turn, can comprise any of a number of devices allowing the entity to receive data from a user, such as a keypad, a touch display, a joystick or other input device.

Still further, while reference is made to the "server" 1200, as one of ordinary skill in the art will recognize, embodiments of the present invention are not limited to traditionally defined server architectures. Still further, the system of embodiments of the present invention is not limited to a single server, or similar network entity or mainframe computer system. Other similar architectures including one or more network entities operating in conjunction with one another to provide the functionality described herein may likewise be used without departing from the spirit and scope of embodiments of the present invention. For example, a mesh network of two or more personal computers (PCs), similar electronic devices, or handheld portable devices, collaborating with one another to provide the functionality described herein in association with the server 1200 may likewise be used without departing from the spirit and scope of embodiments of the present invention.

According to various embodiments, many individual steps of a process may or may not be carried out utilizing the computer systems and/or servers described herein, and the degree of computer implementation may vary, as may be desirable and/or beneficial for one or more particular applications.

FIG. 5B provides an illustrative schematic representative of a mobile device 1300 that can be used in conjunction with various embodiments of the present invention. Mobile devices 1300 can be operated by various parties. As shown in FIG. 5B, a mobile device 1300 may include an antenna 1312, a transmitter 1304 (e.g., radio), a receiver 1306 (e.g., radio), and a processing element 1308 that provides signals to and receives signals from the transmitter 1304 and receiver 1306, respectively.

The signals provided to and received from the transmitter 1304 and the receiver 1306, respectively, may include signaling data in accordance with an air interface standard of applicable wireless systems to communicate with various entities, such as the server 1200, the distributed devices 1110, 1120, and/or the like. In this regard, the mobile device 1300 may be capable of operating with one or more air interface standards, communication protocols, modulation types, and access types. More particularly, the mobile device 1300 may operate in accordance with any of a number of wireless communication standards and protocols. In a particular embodiment, the mobile device 1300 may operate in accordance with multiple wireless communication standards and protocols, such as GPRS, UMTS, CDMA2000, 1×RTT, WCDMA, TD-SCDMA, LTE, E-UTRAN, EVDO, HSPA, HSDPA, Wi-Fi, WiMAX, UWB, IR protocols, Bluetooth protocols, USB protocols, and/or any other wireless protocol.

Via these communication standards and protocols, the mobile device 1300 may according to various embodiments communicate with various other entities using concepts such as Unstructured Supplementary Service data (USSD), Short Message Service (SMS), Multimedia Messaging Service (MMS), Dual-Tone Multi-Frequency Signaling (DTMF), and/or Subscriber Identity Module Dialer (SIM dialer). The mobile device 1300 can also download changes, add-ons, and updates, for instance, to its firmware, software (e.g., including executable instructions, applications, program modules), and operating system.

According to one embodiment, the mobile device 1300 may include a location determining device and/or functionality. For example, the mobile device 1300 may include a GPS module adapted to acquire, for example, latitude, longitude, altitude, geocode, course, and/or speed data. In one embodiment, the GPS module acquires data, sometimes known as ephemeris data, by identifying the number of satellites in view and the relative positions of those satellites.

The mobile device 1300 may also comprise a user interface (that can include a display 1316 coupled to a processing element 1308) and/or a user input interface (coupled to a processing element 1308). The user input interface can comprise any of a number of devices allowing the mobile device 1300 to receive data, such as a keypad 1318 (hard or soft), a touch display, voice or motion interfaces, or other input device. In embodiments including a keypad 1318, the keypad can include (or cause display of) the conventional numeric (0-9) and related keys (#, *), and other keys used for operating the mobile device 1300 and may include a full set of alphabetic keys or set of keys that may be activated to provide a full set of alphanumeric keys. In addition to providing input, the user input interface can be used, for example, to activate or deactivate certain functions, such as screen savers and/or sleep modes.

The mobile device 1300 can also include volatile storage or memory 1322 and/or non-volatile storage or memory 1324, which can be embedded and/or may be removable. For example, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database mapping systems, data, applications, programs, program modules, scripts, source code, object code, byte code, compiled code, interpreted code, machine code, executable instructions, and/or the like to implement the functions of the mobile device 1300.

The mobile device 1300 may also include one or more of a camera 1326 and a mobile application 1330. The camera 1326 may be configured according to various embodiments as an additional and/or alternative data collection feature, whereby one or more items may be read, stored, and/or transmitted by the mobile device 1300 via the camera. The mobile application 1330 may further provide a feature via which various tasks may be performed with the mobile device 1300. Various configurations may be provided, as may be desirable for one or more users of the mobile device 1300 and the system 1020 as a whole.

It will be appreciated that many variations of the above systems and methods are possible, and that deviation from the above embodiments are possible, but yet within the scope of the claims. Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Such modifications may, for example, involve using multiple energy beam sources instead of the exemplified single electron beam source. Still further, although specific terms are employed herein, they are used in a generic and descriptive sense only and not for purposes of limitation.

The invention claimed is:

1. A method for forming a three-dimensional article through successively depositing individual layers of powder material that are fused together so as to form the article, the method comprising the steps of:
   providing at least one electron beam source emitting an electron beam for at least one of heating or fusing the powder material, wherein the electron beam source comprises a cathode, an anode, and a Wehnelt cup positioned between the cathode and anode;
   providing a guard ring between the Wehnelt cup and the anode and in close proximity to the Wehnelt cup, wherein the guard ring has an aperture larger than an aperture of the Wehnelt cup; and
   protecting at least one of the cathode or the Wehnelt cup against vacuum arc discharge energy currents when forming the three-dimensional article by providing the guard ring with a higher negative potential than a negative potential of the Wehnelt cup and the cathode.

2. The method according to claim 1, wherein the guard ring potential is fixed with reference to cathode potential.

3. The method according to claim 1, wherein the guard ring potential is synchronized with the grid cup potential so that the guard ring potential is always 200-400V more negative than the grid cup potential.

4. The method according to claim 1, wherein the guard ring is connected to an electric circuit dedicated to maintain the fixed guard ring potential during the vacuum arc discharge.

5. The method according to claim 1, further comprising the step of aligning a center of an aperture in the Wehnelt cup with a center of an aperture in the guard ring.

6. The method according to claim 1, wherein one or more of the steps recited therein are computer-implemented via at least one control unit or processor.

7. A computer program product comprising at least one non-transitory computer-readable storage medium having computer-readable program code portions embodied therein, the computer-readable program code portions comprising at least one executable portion configured for:
   providing at least one electron beam source emitting an electron beam for at least one of heating or fusing the powder material, wherein the electron beam source comprises a cathode, an anode, and a Wehnelt cup positioned between the cathode and anode;
   providing a guard ring between the Wehnelt cup and the anode and in close proximity to the Wehnelt cup, wherein the guard ring has an aperture larger than an aperture of the Wehnelt cup; and
   protecting the cathode and/or the Wehnelt cup against vacuum arc discharge energy currents when forming the three-dimensional article by providing the guard ring with a higher negative potential than a negative potential of the Wehnelt cup and the cathode.

8. The computer program product according to claim 7, wherein the at least one executable portion is configured such that the guard ring potential is fixed with reference to cathode potential.

9. The computer program product according to claim 7, wherein the at least one executable portion is configured such that the the guard ring potential is synchronized with the grid cup potential so that the guard ring potential is always 200-400V more negative than the grid cup potential.

10. The computer program product according to claim 7, wherein the guard ring is connected to an electric circuit dedicated to maintain the fixed guard ring potential during the vacuum arc discharge.

11. The computer program product according to claim 7, wherein the at least one executable portion is configured for aligning a center of an aperture in the Wehnelt cup with a center of an aperture in the guard ring.

12. An additive manufacturing apparatus for forming a three-dimensional article through successive fusion of parts of at least one layer of powder provided on a work table, which parts corresponds to successive cross sections of the three dimensional article, the apparatus comprising:
   at least one electron beam source emitting an electron beam for at least one of heating or fusing the powder material, the electron beam source comprising a cathode, an anode, and a Wehnelt cup between the cathode and anode; and
   a guard ring positioned between the Wehnelt cup and the anode and in close proximity to the Wehnelt cup, the guard ring having an aperture larger than an aperture of the Wehnelt cup,
   wherein the guard ring is provided with a higher negative potential than the Wehnelt cup for protecting at least one of the cathode or the Wehnelt cup against vacuum arc discharge energy currents when forming the three-dimensional article.

13. The apparatus according to claim 12, wherein the guard ring is connected to an electric circuit dedicated to maintain the fixed guard ring potential during the vacuum arc discharge.

14. The apparatus according to claim 12, further comprising a synchronizing unit for synchronizing the guard ring potential with the grid cup potential so that the guard ring potential is always 200-400V more negative than the grid cup potential.

15. The apparatus according to claim 12, wherein a center of an aperture in the Wehnelt cup is aligned with a center of an aperture in the guard ring.

* * * * *